United States Patent
Li et al.

(10) Patent No.: US 10,770,211 B2
(45) Date of Patent: Sep. 8, 2020

(54) SUPERCONDUCTING MAGNET SYSTEM WITH COOLING ASSEMBLY

(71) Applicant: GE Precision Healthcare LLC, Wauwatosa, WI (US)

(72) Inventors: GuangZhou Li, Florence, SC (US); Anbo Wu, Clifton Park, NY (US); Yihe Hua, Wuxi (CN); Minfeng Xu, Ballston Lake, NY (US); Evangelos Trifon Laskaris, Schenectady, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 435 days.

(21) Appl. No.: 15/572,888

(22) PCT Filed: Apr. 28, 2016

(86) PCT No.: PCT/US2016/029744
§ 371 (c)(1),
(2) Date: Nov. 9, 2017

(87) PCT Pub. No.: WO2016/182748
PCT Pub. Date: Nov. 17, 2016

(65) Prior Publication Data
US 2018/0144851 A1    May 24, 2018

(30) Foreign Application Priority Data

May 11, 2015  (CN) .......................... 2015 1 0236749

(51) Int. Cl.
*H01F 6/04*  (2006.01)
*H01F 27/32*  (2006.01)
(Continued)

(52) U.S. Cl.
CPC ............. *H01F 6/04* (2013.01); *H01F 27/322* (2013.01); *G01R 33/3804* (2013.01); *G01R 33/3815* (2013.01); *G01R 33/3856* (2013.01)

(58) Field of Classification Search
CPC ..... H01F 6/04; H01F 27/322; G01R 33/3804; G01R 33/3815; G01R 33/3856
See application file for complete search history.

(56) References Cited

U.S. PATENT DOCUMENTS 4,079,187 A * 3/1978 Fillunger .................. H01F 6/06
174/15.5
4,541,171 A * 9/1985 Buckley .................. H01F 41/04
264/317
(Continued)

FOREIGN PATENT DOCUMENTS

CN         1509684 A      7/2004
CN       102781311 A     11/2012
(Continued)

OTHER PUBLICATIONS

International Search Report and Written Opinion for International Application No. PCT/US2016/029744, dated Aug. 9, 2016, 16 pages.
(Continued)

*Primary Examiner* — Mohamad A Musleh
(74) *Attorney, Agent, or Firm* — Armstrong Teasdale LLP

(57) ABSTRACT

A superconducting magnet system is provided. The superconducting magnet system includes a coil former, superconducting coils supported by the coil former, and one or more cooling assemblies. The cooling assemblies are in thermal contact with the coil former and include one or more cooling tubes for receiving a cryogen passed therethrough. The cooling assemblies are detachably mounted on the coil former and form at least one cooling circuit therein. The cooling assemblies include one or more flat surfaces
(Continued)

attached on a surface of the coil former. A method of manufacturing the same is also provided.

17 Claims, 14 Drawing Sheets

(51) Int. Cl.
  *G01R 33/38* (2006.01)
  *G01R 33/3815* (2006.01)
  *G01R 33/385* (2006.01)

(56) References Cited

U.S. PATENT DOCUMENTS

| | | | | |
|---|---|---|---|---|
| 4,549,156 | A * | 10/1985 | Mine | H01F 6/04 |
| | | | | 104/285 |
| 5,325,080 | A * | 6/1994 | Chandratilleke | H01F 6/00 |
| | | | | 335/216 |
| 5,404,122 | A * | 4/1995 | Maeda | H01F 6/02 |
| | | | | 335/216 |
| 5,532,663 | A * | 7/1996 | Herd | H01F 6/00 |
| | | | | 335/216 |
| 5,774,032 | A * | 6/1998 | Herd | H02K 55/04 |
| | | | | 335/216 |
| 7,498,814 | B1 * | 3/2009 | Huang | G01R 33/3815 |
| | | | | 324/318 |
| 8,639,305 | B2 * | 1/2014 | Harrison | G01R 33/3804 |
| | | | | 505/163 |
| 2004/0119472 | A1 * | 6/2004 | Laskaris | G01R 33/3815 |
| | | | | 324/318 |
| 2006/0082370 | A1 * | 4/2006 | Cirel | G01R 33/3856 |
| | | | | 324/318 |
| 2006/0284711 | A1 | 12/2006 | Atkins et al. | |
| 2006/0288731 | A1 * | 12/2006 | Atkins | F25D 9/00 |
| | | | | 62/457.9 |
| 2007/0247263 | A1 * | 10/2007 | Calvert | G01R 33/3802 |
| | | | | 335/216 |
| 2012/0202697 | A1 * | 8/2012 | Calvert | G01R 33/3858 |
| | | | | 505/163 |
| 2013/0321109 | A1 | 12/2013 | Yang et al. | |
| 2014/0107468 | A1 | 4/2014 | Calvert | |
| 2014/0274722 | A1 * | 9/2014 | Calvert | G01R 33/3815 |
| | | | | 505/163 |
| 2016/0180996 | A1 * | 6/2016 | Wu | H01F 5/02 |
| | | | | 335/216 |
| 2017/0250018 | A1 * | 8/2017 | Xu | H01F 6/02 |

FOREIGN PATENT DOCUMENTS

| | | |
|---|---|---|
| CN | 103454604 A | 12/2013 |
| CN | 103620436 A | 3/2014 |
| CN | 103811145 A | 5/2014 |
| WO | 2012143172 A1 | 10/2012 |

OTHER PUBLICATIONS

Machine Translation and Second Office Action and Search issued in connection with corresponding CN Application No. 201510236749.0 dated May 22, 2018, 18 pages.

Chinese OA for Application No. 201510236749.0, dated Aug. 8, 2017, 8 pages.

* cited by examiner

SUPERCONDUCTING MAGNET SYSTEM WITH COOLING ASSEMBLY

CROSS-REFERENCE TO RELATED APPLICATIONS

This is a national stage application under 35 U.S.C. § 371 (c) of PCT Patent Application No. PCT/US2016/029744, filed on Apr. 28, 2016, which claims priority to Chinese Patent Application No. 201510236749.0, filed on May 11, 2015, the disclosures of which are incorporated herein by reference in their entireties.

BACKGROUND

Embodiments of the disclosure relate generally to superconducting magnet systems and a cooling assembly, and more particularly to superconducting magnet systems including a cooling assembly.

Superconducting magnet systems having relatively large energies are currently used in many applications. For example, superconducting magnet systems, storing energies of up to 15M Joules, are constructed for Magnetic Resonance Imaging (MRI) systems which are now routinely used in large numbers in clinical environments for medical imaging. A part of such an MRI system is a superconducting magnet system for generating a uniform magnetic field. The superconducting magnet systems also can be utilized in other systems, such as nuclear magnetic resonance (NMR) systems, accelerators, transformers, generators, motors, superconducting magnet energy storages (SMES) and so on.

Superconducting magnets conduct electricity without resistance as long as maintained at a suitably low temperature, which is referred to as "superconducting temperature" hereinafter. Accordingly, cryogenic systems are used to ensure that the superconducting magnets work at the superconducting temperature. Heat transfer efficiency is very important for superconducting magnets. The cryogenic systems include cooling tubes carrying cryogen therethrough to cool coil formers. In one conventional superconducting magnet system, the cooling tubes are welded on the coil former and welded to each other on the coil former. Welding material in welding seam between the cooling tubes and the coil former transforms from liquid to solid during welding that results in distortion of the coil former. And about twelve or more joints between the cooling tubes should be welded on the coil former. It is difficult to handle the joints of the cooling tubes in different sub-assemblies during welding. After welding, all of the joints are helium-tight tested on the coil former one by one to make sure all the joints are helium-tight, and a pressure-tight test is also required to detect if the cooling tubes are leak. Moreover, leaking points are difficult to be repaired which are found in the tests.

It is desirable to provide a solution to address at least one of the above-mentioned problems.

BRIEF DESCRIPTION

A superconducting magnet system is provided. The superconducting magnet system includes a coil former, superconducting coils supported by the coil former, and one or more cooling assemblies. The cooling assemblies are in thermal contact with the coil former and include one or more cooling tubes for receiving a cryogen passed therethrough. The cooling assemblies are detachably mounted on the coil former and form at least one cooling circuit therein. The cooling assemblies include one or more flat surfaces attached on a surface of the coil former.

Another superconducting magnet system is provided. The superconducting magnet system includes a coil former, superconducting coils supported by the coil former, and one or more thermal conductive devices. The thermal conductive devices are thermally coupled with the coil former and the superconducting coils. The thermal conductive devices are mechanically engaged with the coil former and include a flat surface attached on a surface of the coil former to form a thermal conduction therebetween.

A cooling assembly for cooling a coil former is provided. The cooling assembly includes a number of cooling tubes and a number of fixing elements. The cooling tubes are connected with each other for receiving a cryogen passed therethrough and form at least one cooling circuit therein. The fixing elements are coupled with the cooling tubes for detachably mounting the cooling tubes to the coil former.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Figure 1:
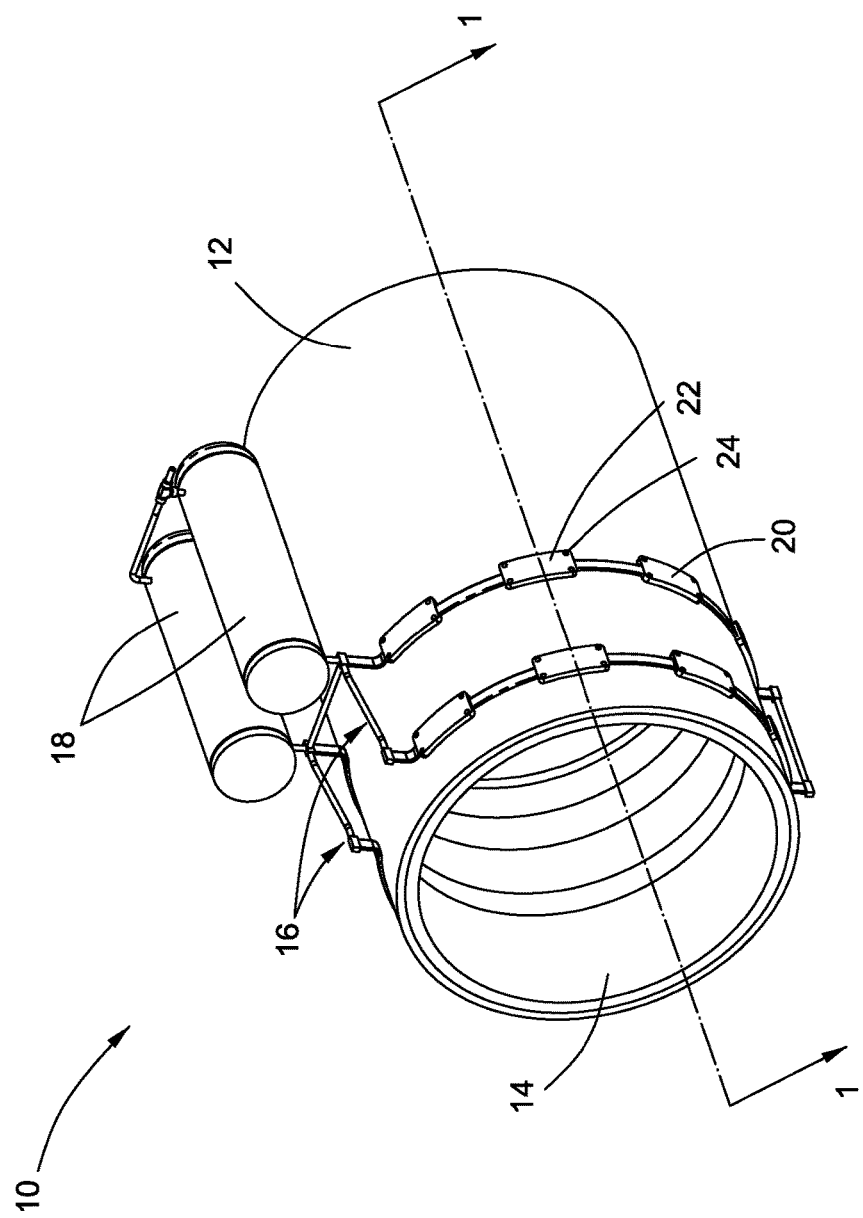
FIG. 1 is a perspective view of a superconducting magnet system according to one embodiment.

FIG. 1 illustrates a perspective view of a superconducting magnet system 10 according to one embodiment. The superconducting magnet system 10 can be used in many suitable fields, such as a magnetic resonance imaging (MRI) system, a nuclear magnetic resonance (NMR) system, an accelerator, a transformer, a generator, a motor, a superconducting magnet energy storage (SMES) and so on. The superconducting magnet system 10 includes a coil former 12, a number of superconducting coils 14 supported by the coil former 12, one or more cooling assemblies 16 in thermal contact with the coil former 12. The coil former 12 has cylindrical shape. Other shapes are possible for the coil former 12. The coil former 12 includes a solid, thermally-conductive, mechanical former, for example made of aluminum. In this embodiment, the superconducting coils 14 are wound or assembled and attached on an inner surface of the coil former 12. In other embodiments, the superconducting coils 14 may be wound or assembled on an outer surface of the coil former 12.

The cooling assemblies 16 are arranged to receive a cryogen (not shown) passed therethrough to cool the coil former 12. The cryogen may be liquid helium, liquid hydrogen, liquid nitrogen, liquid neon, and the like. The cryogen is chosen to have a temperature lower than the superconductor critical temperature required by the combination of current density and magnetic field at which the superconductor will be operating. In this embodiment, the superconducting magnet system 10 has two cooling assemblies 16 respectively connected to cryogen containers 18. In another embodiment, one or more than two cooling assemblies 16 may be employed. The cryogen container 18 is configured to contain the cryogen. In this embodiment, two cryogen containers 18 are provided. In another embodiment, one cryogen container 18 may be employed. In one embodiment, the cryogen container 18 may be made of metal material, such as stainless steel and the like. The cryogen in the cryogen containers 18 is cooled by a refrigerator (not shown) connected thereto.

The cooling assemblies 16 are detachably mounted on the coil former 12. In the illustrated embodiment, the superconducting magnet system 10 includes multiple fixing elements 20 attaching the cooling assemblies 16 to the coil former 12. In the illustrated embodiment, each fixing element 20 includes a clamping pad 22 and multiple bolts or screws 24. The clamping pad 22 clamps the cooling assembly 16 and the bolts or screws 24 are screwed through the clamping pad 22 to the coil former 12 tightly so as to attaching the cooling assemblies 16 to the coil former 12 tightly. The cooling assemblies 16 can be removed from the coil former 12 through releasing the fixing elements 20. In another embodiment, the fixing elements 20 may have any other structures to attach the cooling assemblies 16 to the coil former 12.

Thus, the cooling assemblies 16 are easily mounted to and removed from the coil former 12. The cooling assemblies 16 can be conveniently repaired or replaced when the cooling assemblies 16 leak or are damaged. And the distortion of the coil former 12 is avoided, which is caused by welding the cooling assemblies 16 to the coil former 12. In this embodiment, the cooling assemblies 16 serve as thermal conductive devices thermally coupled with the coil former 12 and the superconducting coils 14 to cool the former 12 and the superconducting coils 14. The cooling assemblies 16 are mechanically engaged with the coil former through the fixing elements 20.

Figure 2:
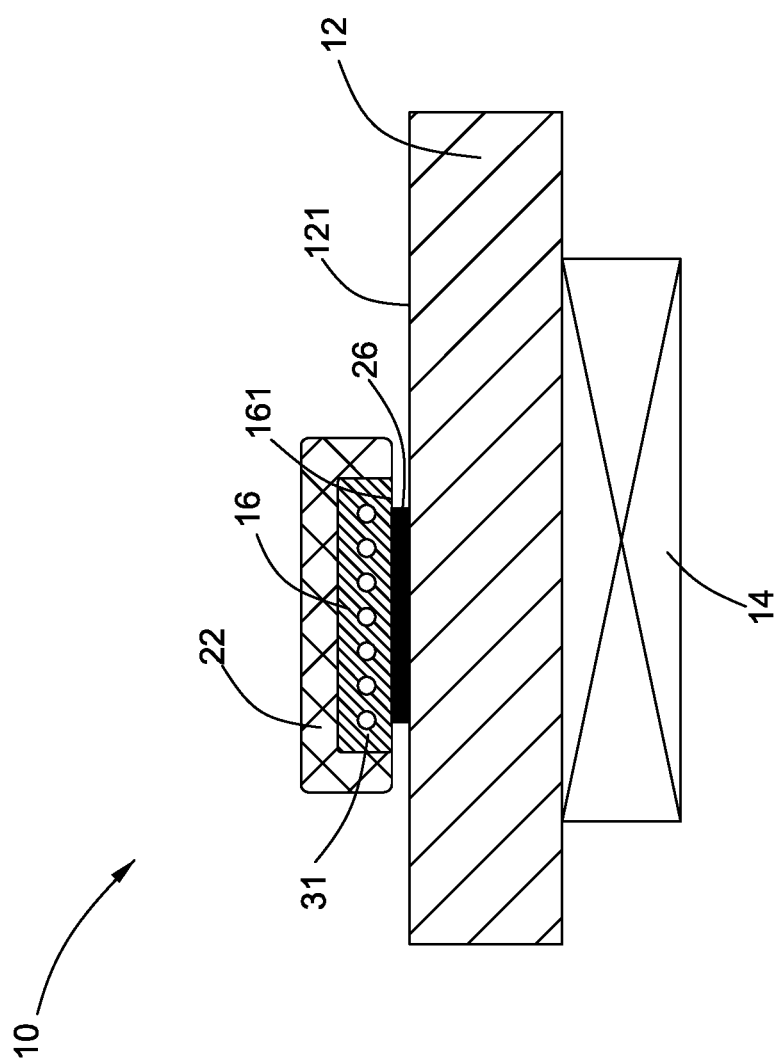
FIG. 2 is schematic cross-sectional view of part of the superconducting magnet system taken along line 1-1 in FIG. 1.

FIG. 2 illustrates a schematic cross-sectional view of part of the superconducting magnet system 10 taken along the line 1-1 in FIG. 1. The cooling assembly 16 includes a flat surface 161 attached on a surface 121 of the coil former 12 to form a thermal conduction therebetween so as to promote a relatively large area for contact with the coil former 12. In this embodiment, the cooling assembly 16 at least in part includes a rectangular cross-section cooling tube 31 having the flat surface 161.

In the illustrated embodiment, the superconducting magnet system 10 includes filling material 26 filling a gap between the cooling assembly 16 and the coil former 12. The filling material 26 is in thermal contact with the coil former 12 and the cooling assembly 16. The filling material 26 is capable of filling tiny seams between the flat surface 161 of the cooling assembly 16 and the surface 121 of the coil former 12 in a vacuum to further promote the contacting area therebetween in the vacuum, thus thermal resistance is reduced and the thermally conduction therebetween is further improved. The clamping pads 22 of the fixing elements 20 press the cooling assembly 16 to the coil former 12. Accordingly, the filling material 26 is formed a thin layer between the cooling assembly 16 and the coil former 12 due to the pressure of the clamping pads 22, so as to improve the thermally conduction. The thin layer has a thickness about 0.13 mm or 0.20 mm in one example. In one example, the filling material 26 includes epoxy and/or grease. In another example, the filling material 26 includes any other high thermally conductive material which is capable of filling the tiny gas in the vacuum. The cooling assemblies 16, in one example, include metal material with high thermally conductive character, such as aluminum, copper and stainless steel. Accordingly, the cooling assemblies 16 can be removed from the coil former 12 without being damaged even if the sticky epoxy is employed as the filling material 26.

Figure 3:
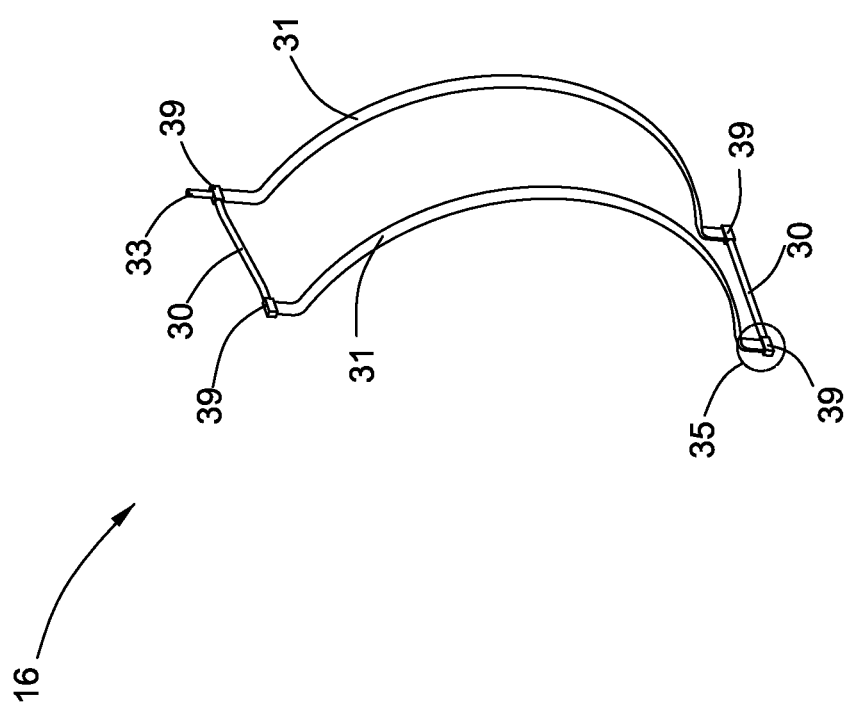
FIG. 3 is a perspective view of a cooling assembly of the superconducting magnet system of FIG. 1.

FIG. 3 illustrates a perspective view of the cooling assembly 16 of the superconducting magnet system 10 in FIG. 1. The cooling assembly 16 includes multiple cooling tubes 30 and 31 for receiving the cryogen passed therethrough. The cooling tubes 30 and 31 are in fluid communication with each other to form at least one cooling circuit therein. The cooling tubes 31 each include an arch shape matching the coil former 12, which are attached on the surface of the coil former 12. The cooling assembly 16 surrounds half circle or less than half circle of the coil former 12 so as to easily assemble the cooling assembly 16 to the coil former 12 without deforming the cooling assembly 16. The cooling tubes 31 each are flat tubes that have the flat surfaces 161 as shown in FIG. 2. In this embodiment, the cooling tubes 30 are connected the cooling tubes 31, which may be cylindrical tubes in one example. The cooling assembly 16 further includes an inlet/outlet tube 33 coupled to the cryogen container 18 shown in FIG. 1.

Figure 4:
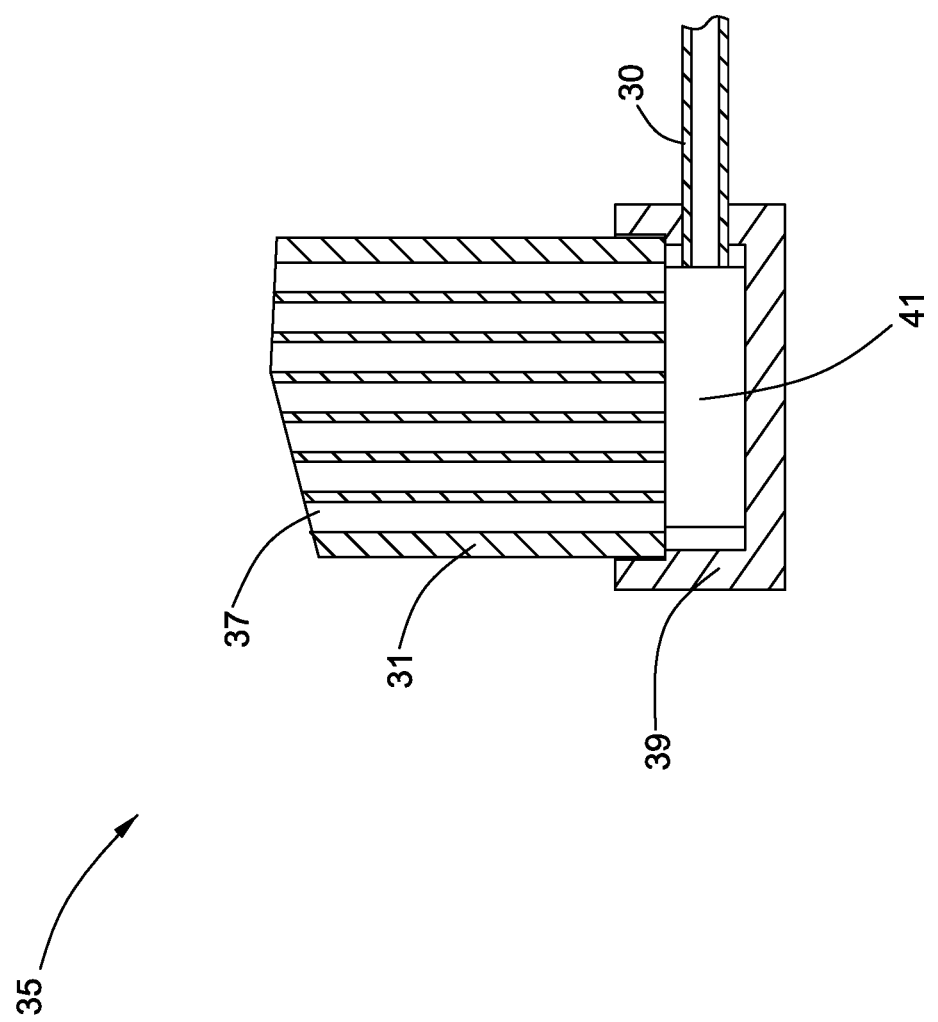
FIG. 4 is a cross-sectional view of a part of the cooling assembly of FIG. 3.

FIG. 4 illustrates a cross-sectional view of a part 35 of the cooling assembly 16 of FIG. 3. In this embodiment, each of the cooling tubes 31 is a harmonica-shaped tube which includes a number of channels 37 therein for allowing the cryogen to flow therethrough. The channels 37 are in fluid communication with each other so as to improve cooling efficiency. In this embodiment, the cooling assembly 16 further includes a joint block 39 coupled with the harmonica-shaped tube 31. The joint block 39 includes a tank 41 in fluid communication with the channels 37 of the harmonica-shaped tube 31 to communicate fluidly all the channels 37. And the cooling tube 30 is also in fluid communication with the tank 41 of the joint block 39.

In the illustrated embodiment of FIG. 3, the cooling assembly 16 includes four joint blocks 39 each connected the corresponding cooling tube 31 to the corresponding cooling tube 30. The cooling tubes 30, 31 and the joint blocks 39 are connected tightly through, for example, brazing and/or welding to make sure the cooling assembly 16 is helium tight and pressure tight. Before the cooling assembly 16 is mounted on the coil former 12, the cooling tubes 30, 31 and the joint blocks 39 are assembled and the cooling assembly 16 is helium-tight tested and pressure-tight tested. After the cooling assembly 16 meets pressure vessel code, the cooling assembly 16 is clamped to the coil former 12. Thus, the cooling assembly 16 is easily welded or brazed. In another embodiment, the cooling assembly 16 may have any other structure. For example, the cooling assembly 16 has single harmonica-shaped tube 31 connected to the cryogen container 18.

Figure 5:
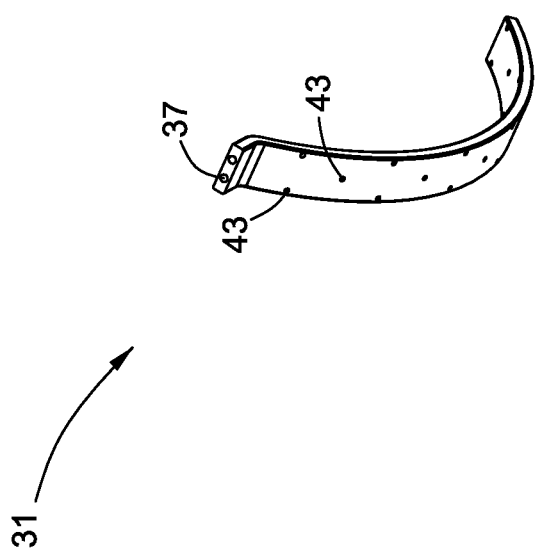
FIG. 5 is a perspective view of a cooling tube of the cooling assembly of FIG. 3 according to another embodiment.

FIG. 5 illustrates a perspective view of the cooling tube 31 of the cooling assembly 16 of FIG. 3 according to another embodiment. Compared with the cooling tube 31 in FIG. 3, the cooling tube 31 in FIG. 5 includes multiple fixing holes 43 therein for the bolts or screws screwing through to attaching the cooling tube 31 to the coil former 12. In this embodiment, the cooling tube 31 is wider than the cooling tube 31 of FIG. 3. The cooling tube 31 is wide enough to provide space for the fixing holes 43. In this embodiment, the cooling tube 31 is also a harmonica-shaped tube. The fixing holes 43 do not reach the channel 37 in the cooling tube 31.

Figure 6:
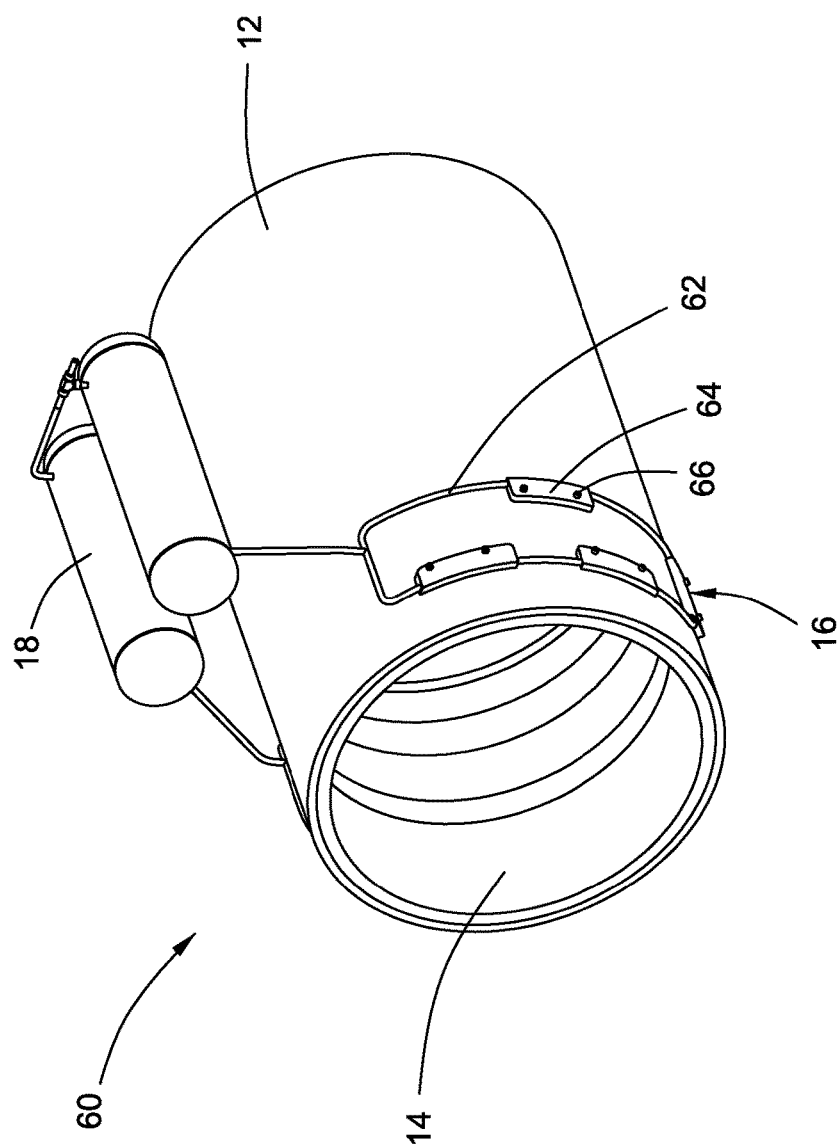
FIG. 6 is a perspective view of the superconducting magnet system according to another embodiment.

FIG. 6 illustrates a perspective view of a superconducting magnet system 60 according to another embodiment. The superconducting magnet system 60 is similar to the superconducting magnet system 10 in FIG. 1. Compared with the embodiment of FIG. 1, in the embodiment of FIG. 6 the cooling assembly 16 includes one or more cooling tubes 62 and one or more thermal pads 64 connected with the cooling tubes 62. The thermal pads 64 are in thermal contact with the coil former 12. The filling material 26 in FIG. 2 can be used to filling the gap between the thermal pads 64 and the coil former 12 to improve thermal conduction therebetween. The thermal pads 64 can be located at parts of the coil former 12 where high heat loads are located. For example, the thermal pads 64 can be located close to a suspension system (not shown), power leads (not shown) and so on. Thereby, the cost of the cooling assembly 16 is reduced. Further, the number, shapes and sizes of the thermal pads 64 can be set according to the particular applications to balance performance and cost. In one embodiment, the thermal pads 64 can be set according to a layout of the superconducting magnet system.

Figure 7:
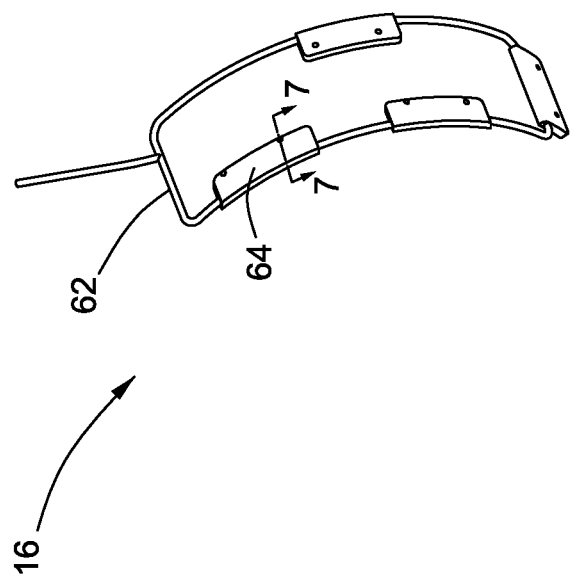
FIG. 7 is a perspective view of the cooling assembly of the superconducting magnet system of FIG. 6.

FIG. 7 illustrates a perspective view of the cooling assembly 16 of FIG. 6. In this embodiment, the thermal pads 64 each include an arch shape matching the surface of the coil former 12. In one example, the thermal pads 64 include aluminum, copper or a combination of them to make sure good thermal conduction between the thermal pads 64 and the coil former 12. In another example, the thermal pads 64 may include any other thermal conducive material. In this embodiment, the cooling tubes 62 have circular cross-sections. In one example, the cooling tubes 62 include stainless steel so that the cooling tubes 62 are easily welded to the cryogen container 18. The thermal pads 64 and the cooling tubes 62 are pre-assembled and tested before mounting to the coil former 12.

Figure 8:
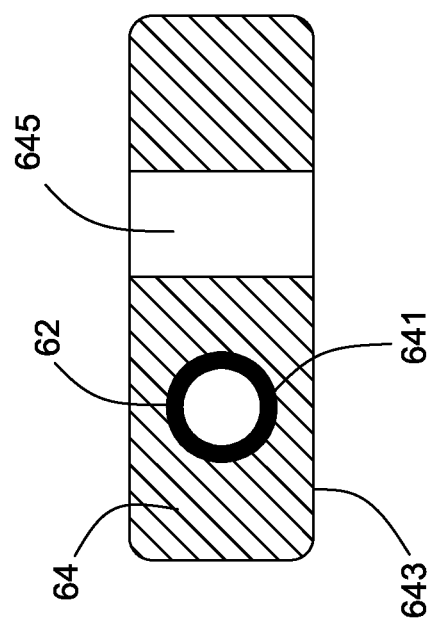
FIG. 8 is a cross-sectional view of the cooling assembly taken along line 7-7 in FIG. 7.

FIG. 8 illustrates a cross-sectional view of the cooling assembly 16 taken along the line 7-7 in FIG. 7. In this embodiment, the thermal pad 64 includes a hole 641 accommodating the cooling tube 62 therethrough and the cooling tube 62 within the hole 641 is in thermal contact with the thermal pad 64. The cooling tube 62 is engaged with the thermal pad 64 tightly. In another embodiment, the cooling tube 62 is connected with the thermal pad 64 without passing therethrough. The cooling tube 62 is in fluid communication with the hole 641 of the thermal pad 64 for receiving the cryogen. The thermal pad 64 has a flat surface 643 attached to the coil former 12 for thermal conduction. In this embodiment, the thermal pad 64 includes a fixing hole 645 for receiving the fixing element 66 in FIG. 6, such as bolt or screw, therethrough to attach the cooling assembly 16 to the coil former 12.

Figure 9:
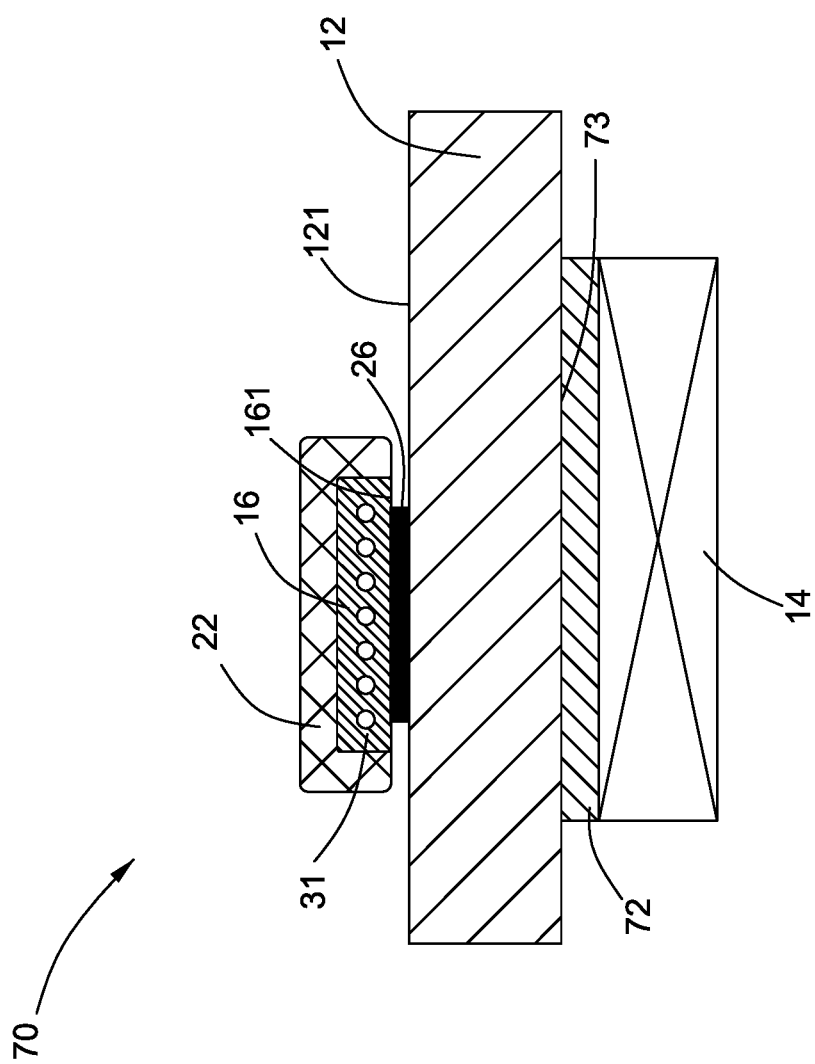
FIG. 9 is a schematic cross-sectional view of part of the superconducting magnet system according to another embodiment.

FIG. 9 illustrates a schematic cross-sectional view of part of the superconducting magnet system 70 according to another embodiment. The superconducting magnet system 70 in FIG. 9 is similar to the superconducting magnet system 10 in FIG. 2. Compared with the embodiment in FIG. 2, the superconducting magnet system 70 further includes an electrically conductive shield 72. In this embodiment, the electrically conductive shield 72 serves as the thermal conductive device thermally coupled to the coil former 12 and the superconducting coils 14. The electrically conductive shield 72 is attached on the surface of the coil former 12 and includes a surface 73 attached on a surface of the coil former to form a thermal conduction therebetween. The superconducting coils 14 are positioned on the same side of both the coil former 12 and the electrically conductive shield 72. In the illustrated embodiment, the electrically conductive shield 72 is positioned between the coil former 12 and the superconducting coils 14. In one embodiment, the electrically conductive shield 72 and the superconducting coils 14 are positioned on the inner surface of the coil former 12. In another embodiment, the electrically conductive shield 72 and the superconducting coils 14 are positioned on the outer surface of the coil former 12.

The electrically conductive shield 72 includes an electrically and thermally conductive material, such as copper which is high thermally conductive in low temperature, or aluminum with high purity. The electrical conductivity of the conductive shield 72 is higher than that of the coil former 12. The electrically conductive shield 72 is mechanically engaged with the coil former 12. In one embodiment, the electrically conductive shield 72 is a ring clamped on the coil former 12 for providing magnetic shielding of gradient pulsing to reduce joule heat in the coil former 12. The gradient pulsing is generated during the superconducting magnet system 70 is operated, which causes a changed electric field and a changed magnetic field. The electric field can cause an eddy current through metal components including the coil former 12 if the electrically conductive shield 72 is not employed, and further the eddy current results in the joule heat at the metal components. The electrically conductive shield 72 is high electrically conductive so that the eddy current only occurs at the surface of the electrically conductive shield 72. The electrically conductive shield 72 shields the electric field and the magnetic field to avoid the eddy current and the joule heat occur at the coil former 12 and other metal components.

The electrically conductive shield 72 covers the whole superconducting coils 14. One or more electrically conductive shields 72 may be employed according to particular applications. For one superconducting coil 14, when a part of the superconducting coil 14 quenches, the part of the superconducting coil 14 becomes high-heat. The heat transfers to the electrically conductive shield 72 and is further transferred by the electrically conductive shield 72 to other parts of the superconducting coil 14 quickly that makes the other parts quench. Accordingly, the electrically conductive shield 72 disperses the heat to avoid the part of the superconducting coil 14 too hot. In addition, eddy current occurs when the superconducting coil 14 quenches, and a part of the electrically conductive shield 72 is heated due to the eddy current. The electrically conductive shield 72 also disperses the heat thereof quickly. The electrically conductive shield 72 provides a quick thermal conduction path. The electrically conductive shield 72 is also employed to transfer heat from the coil former 12 or the like quickly to the cooling tubes in normal operation state.

In one embodiment, the grease is employed to fill between the coil former 12 and the electrically conductive shield 72, and/or between the electrically conductive shield 72 and the superconducting coils 14. In this embodiment, the cooling assembly 16 in FIG. 1 is employed. In another embodiment, the cooling assembly 16 in FIG. 6 may be employed. In still another embodiment, any other cooling assemblies may be employed to cooling the coil former 12.

Figure 10:
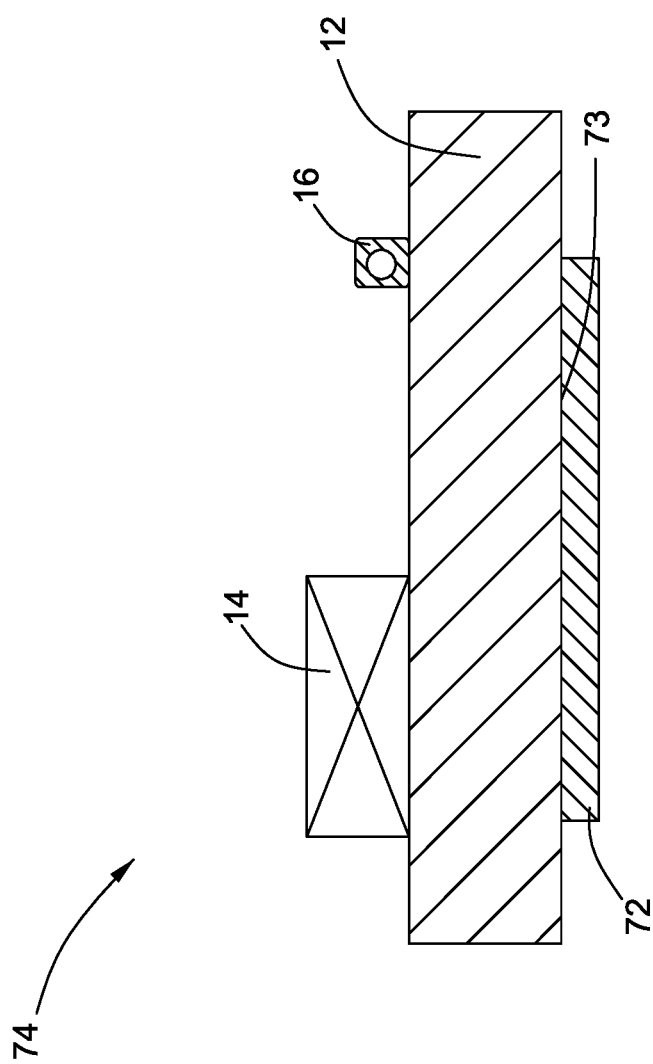
FIG. 10 is a schematic cross-sectional view of part of the superconducting magnet system according to another embodiment.

FIG. 10 illustrates a schematic cross-sectional view of part of the superconducting magnet system 74 according to another embodiment. The superconducting magnet system 74 in FIG. 10 is similar to the superconducting magnet system 70 in FIG. 9. Compared with the embodiment in FIG. 9, the electrically conductive shield 72 of the superconducting magnet system 74 and the superconducting coils 14 are respectively positioned on opposite surfaces of the coil former 12. In this embodiment, the electrically conductive shield 72 is positioned on the inner surface of the coil former 12 and the superconducting coils 14 are positioned on the outer surface of the coil former 12. In another embodiment, the electrically conductive shield 72 is positioned on the outer surface of the coil former 12 and the superconducting coils 14 are positioned on the inner surface of the coil former 12.

Figure 11:
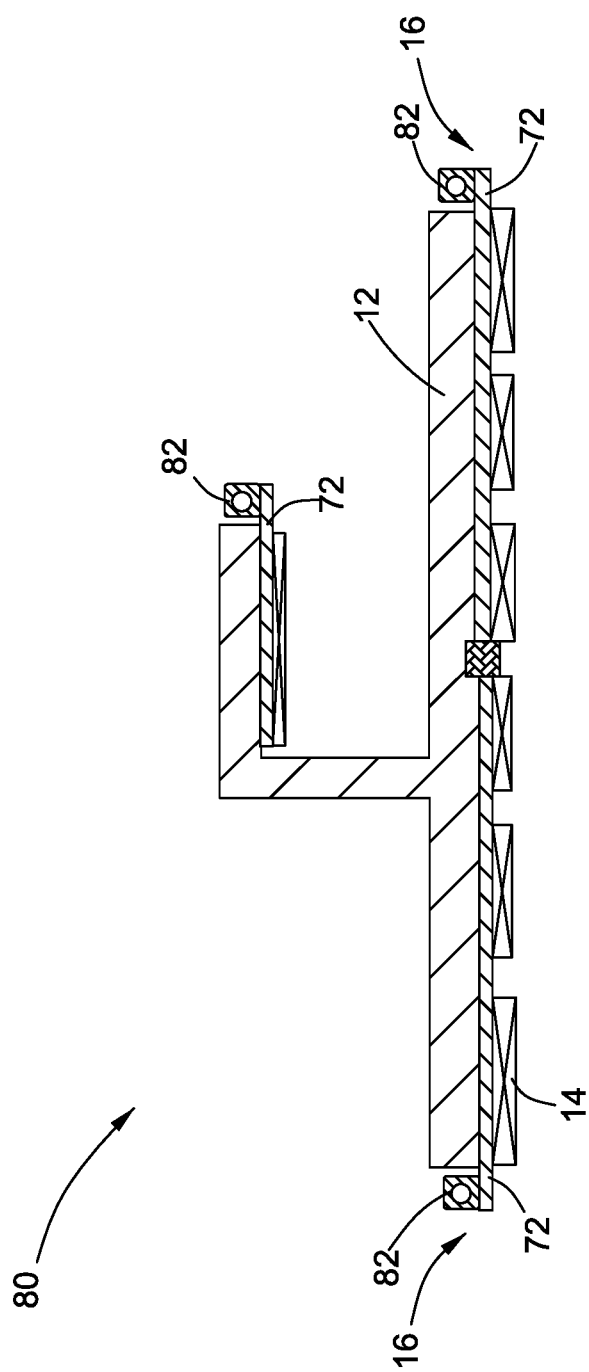
FIG. 11 is a schematic cross-sectional view of part of the superconducting magnet system according to another embodiment.

FIG. 11 illustrates a schematic cross-sectional view of part of the superconducting magnet system 80 according to another embodiment. In this embodiment, the cooling assemblies 16 each include a cooling tube 82 and the electrically conductive shield 72 similar to the electrically conductive shield 72 in FIG. 9. The cooling tubes 82 are positioned on the electrically conductive shields 72 that provide a thermal cooling path. The electrically conductive shields 72 can disperse heat quickly, thus using only one or two cooling tubes 82 in each cooling assembly 16 can achieve good performance on cooling. Accordingly, the structure of the cooling assembly 16 is simplified. In another embodiment, each of the cooling assemblies 16 includes two or more cooling tubes 82. In this embodiment, the cooling tubes 82 are flat tubes which have flat surfaces attached on the electrically conductive shields 72 for providing good thermal conduction. The cooling tubes 82 are mounted on the electrically conductive shield 72 through welding, brazing, or soldering for example. In another embodiment, the harmonica-shaped tube 31 shown in FIGS. 4 and 5 may be utilized. In one embodiment, the cooling tube 82 and the electrically conductive shield 72 is assembled before mounting them to the coil former 12.

Figure 12:
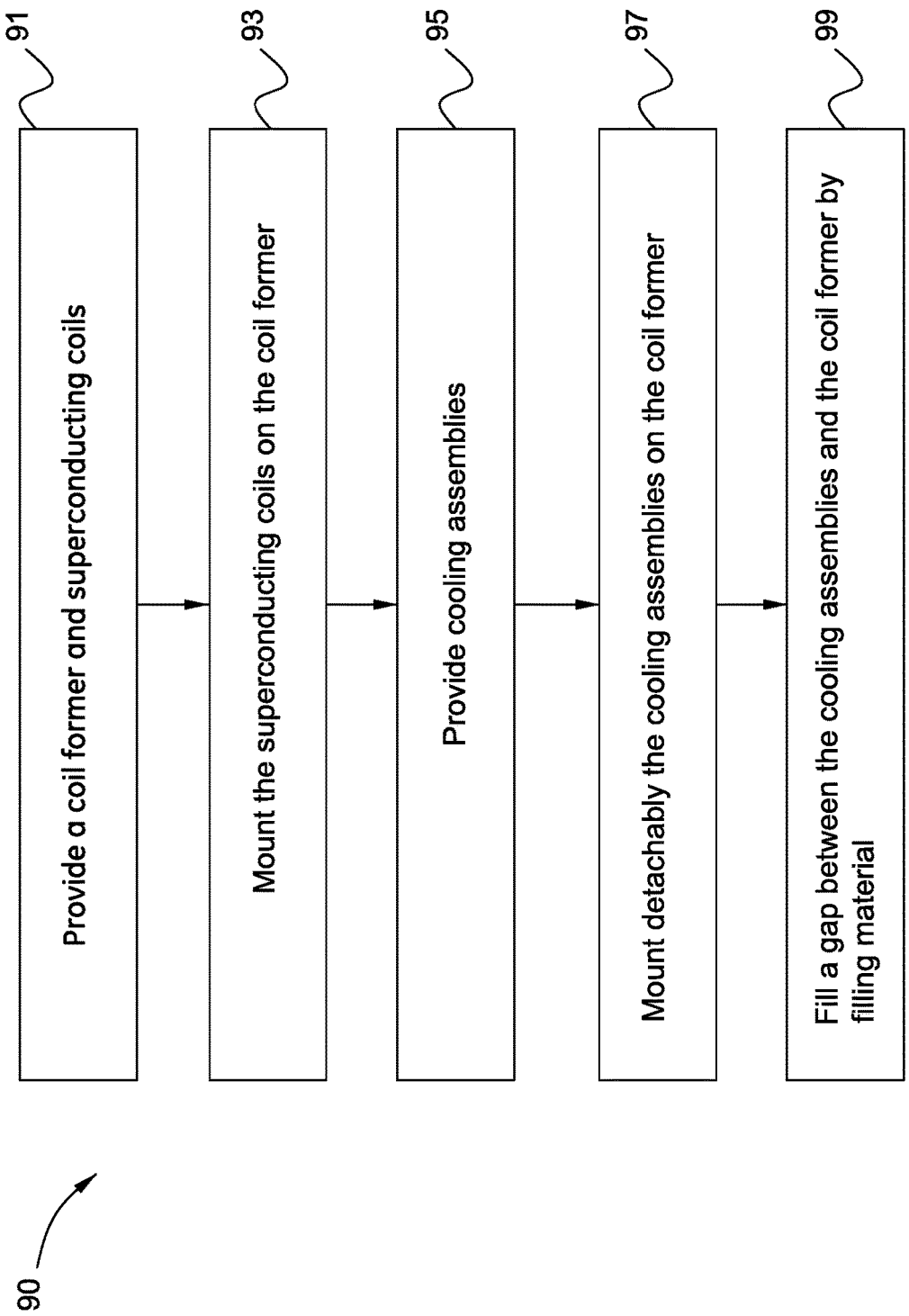
FIG. 12 is a flow chart of a method of manufacturing the superconducting magnet system according to one embodiment.

FIG. 12 illustrates a flow chart of a method 90 of manufacturing a superconducting magnet system according to one embodiment. In block 91, a coil former and superconducting coils are provided. The coil former may be made of aluminum alloy in one embodiment. In block 93, the superconducting coils are mounted on the coil former. The superconducting coils encircle the coil former. In one embodiment, the superconducting coils are mounted on an inner surface of the coil former. In another embodiment, the superconducting coils are mounted on an outer surface of the coil former. The superconducting coils may be mounted to the coil former through a thermal shrink fit method.

In block 95, one or more cooling assemblies are provided. The cooling assembly includes one or more cooling tubes and forms at least one cooling circuit therein. The cooling assembly is assembled, helium-tight tested and pressure-tight tested. In one embodiment, a harmonica-shaped tube is formed as the cooling tube, which includes multiple channels therein in fluid communication with each other. The harmonica-shaped tube carries the cryogen therein to cool the coil former. In one embodiment, a joint block is provided and connected with the harmonica-shaped tube. The joint block includes a tank in fluid communication with the channels of the harmonica-shaped tube to communicate fluidly all the channels.

In block 97, the cooling assemblies are mounted detachably on the coil former. The cooling assemblies are in thermal contact with the coil former to cool the coil former. The cooling assembly includes a flat surface attached on a surface of the coil former to promote a relatively large area for contact with the coil former. The cooling assemblies can be removed from the coil former easily without being damaged. In one embodiment, the cooling assemblies are attached to the coil former via multiple fixing elements. The fixing elements clamp the cooling assemblies to the coil former. In another embodiment, one or more thermal pads are connected with the one or more cooling tubes, and the thermal pads are fixed on the coil former. The thermal pads are in thermal contact with the coil former. The thermal pads and the cooling tubes are assembled to form the cooling assembly.

In block 99, in one embodiment, a gap between the cooling assemblies and the coil former is filled by filling material to promote good thermal conduction. The filling material is in thermal contact with the coil former and the cooling assemblies. In one embodiment, the filling material, such as epoxy and grease, is painted on the flat surface of the cooling assembly before the cooling assembly is mounted to the coil former. In another embodiment, the filling material is painted on the surface of the coil former in advance.

Figure 13:
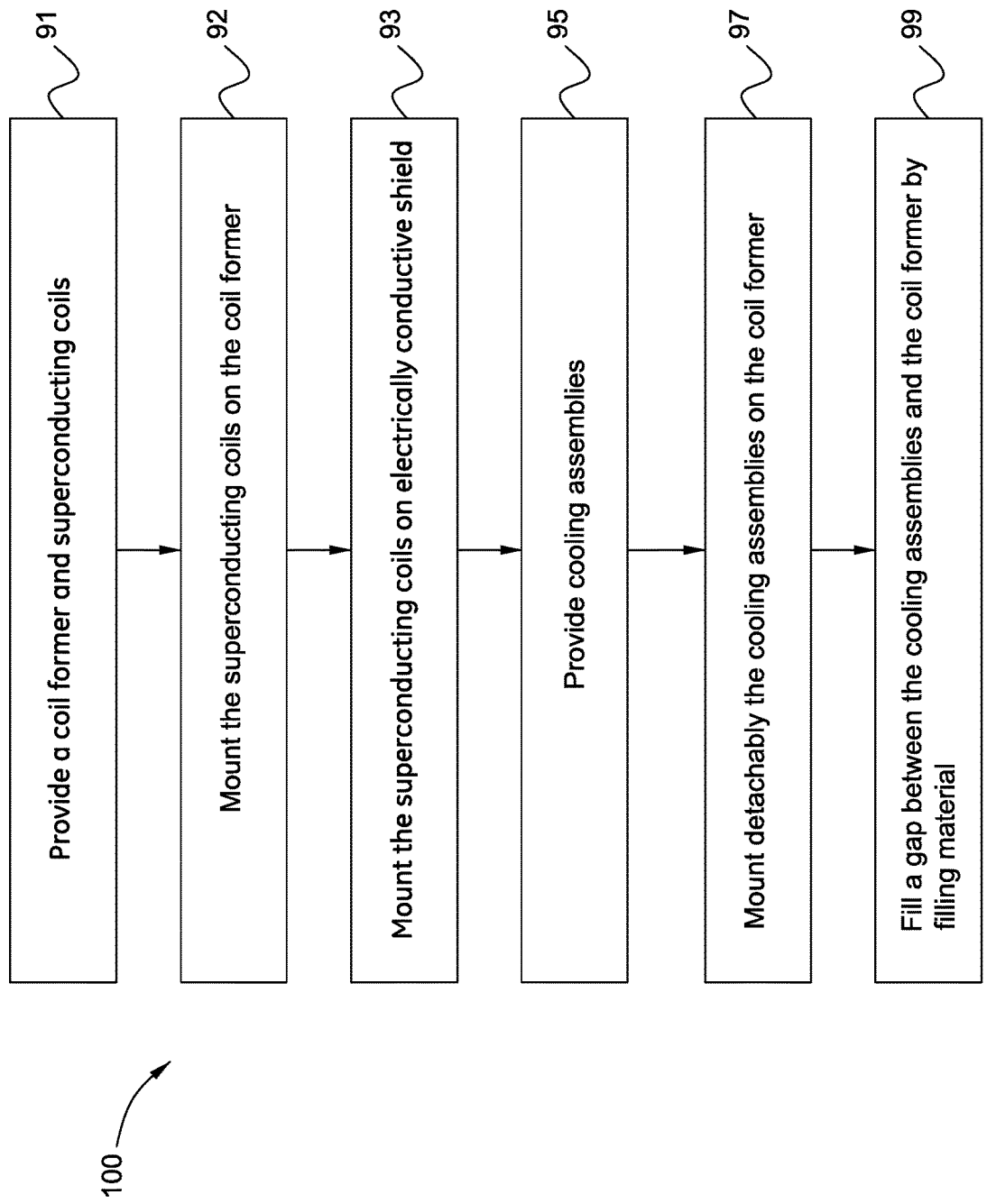
FIG. 13 is a flow chart of the method of manufacturing the superconducting magnet system according to another embodiment.

FIG. 13 illustrates a flow chart of a method 100 of manufacturing a superconducting magnet system according to another embodiment. Compared with the method 90 in FIG. 12, the method 100 further includes mounting an electrically conductive shield between the coil former and the superconducting coils, in block 92. The electrically conductive shield includes an electrically and thermally conductive material. The electrically conductive shield is mounted on the coil former and then the superconducting coils are mounted on the electrically conductive shield.

Figure 14:
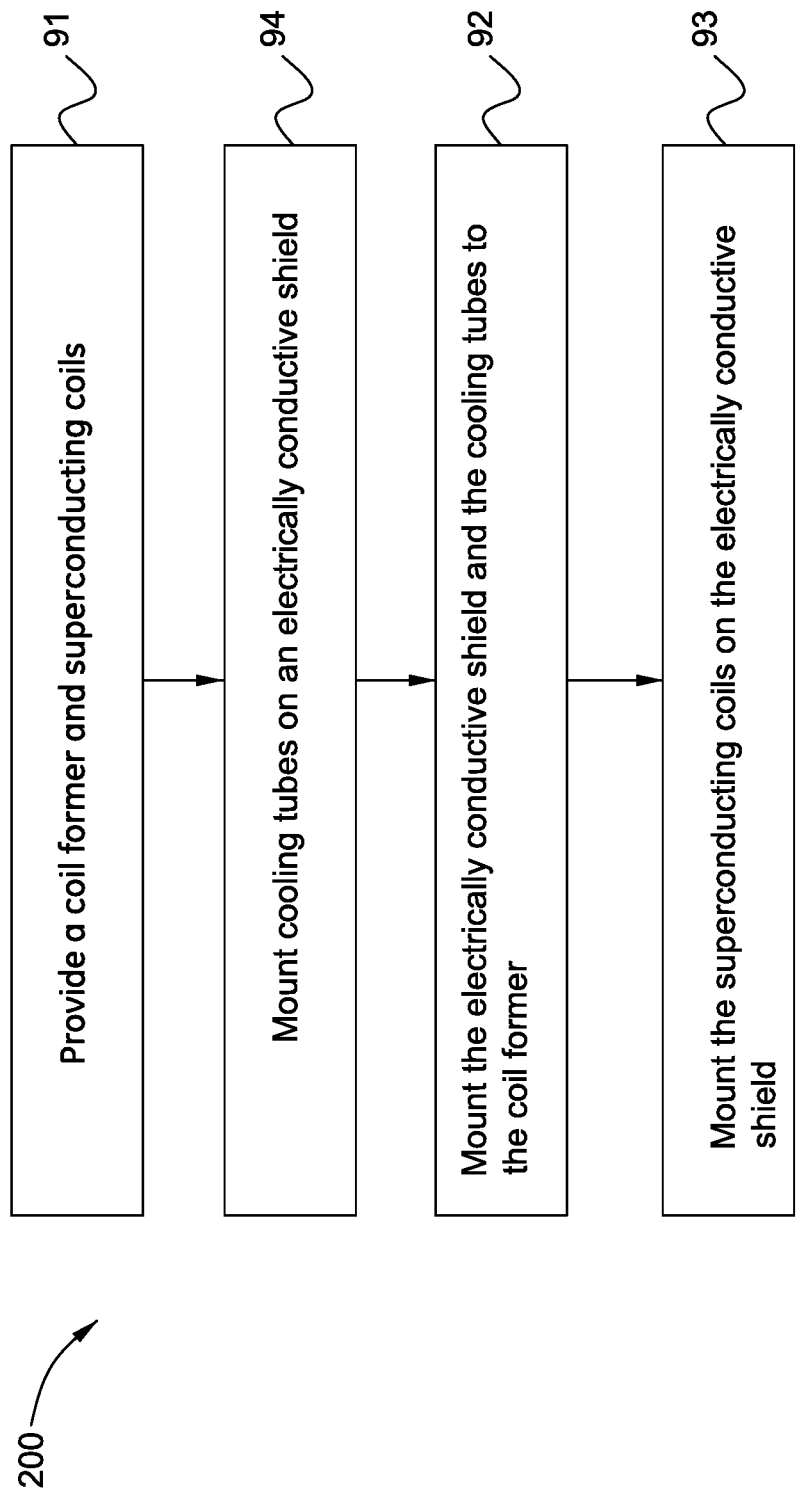
FIG. 14 is a flow chart of the method of manufacturing the superconducting magnet system according to another embodiment.

FIG. 14 illustrates a flow chart of a method 200 of manufacturing a superconducting magnet system according to still another embodiment. Compared with the method 100 in FIG. 13, the method 200 includes mounting the cooling tubes on the electrically conductive shield, in block 94, before mounting the electrically conductive shield between the coil former and the superconducting coils. The cooling tubes and the electrically conductive shield are assembled to form the cooling assembly, and then the electrically conductive shield and the cooling tubes are mounted to the coil former. After that, the superconducting coils are mounted on the electrically conductive shield. In this embodiment, the cooling tubes are thermal contact with the coil former through the electrically conductive shield. In this embodiment, the filling material such as epoxy can be utilized between the electrically conductive shield and the coil former, and/or between the electrically conductive shield and the superconducting coils.

While the actions of the methods 90, 100 and 200 are illustrated as functional blocks, the order of the blocks and the separation of the actions among the various blocks shown in FIGS. 12-14 are not intended to be limiting. For example, the blocks may be performed in a different order and an action associated with one block may be combined with one or more other blocks or may be sub-divided into a number of blocks.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A superconducting magnet system, comprising:
   a coil former comprising a first surface;
   a plurality of superconducting coils supported by the coil former; and
   one or more cooling assemblies in thermal contact with the coil former, each cooling assembly of the one or more cooling assemblies comprising:
   a housing defining an aperture extending therethrough;
   one or more-cooling-tubes located within the housing for receiving a cryogen passed therethrough; and
   a second surface attached on the first surface of the coil former; and
   a fastener removably received within the aperture in the housing and extending through the first surface of the coil former to detachably mount the cooling assembly on the coil former, the cooling assembly forming at least one cooling circuit therein.

2. The superconducting magnet system of claim 1, further comprising a filling material filling a gap between the one or more cooling assemblies and the coil former, and wherein the filling material is in thermal contact with the coil former and the one or more cooling assemblies.

3. The superconducting magnet system of claim 1, wherein the one or more cooling tubes comprise a harmonica-shaped tube comprising a plurality of channels therein for allowing the cryogen to flow therethrough, and the plurality of channels are in fluid communication with each other.

4. The superconducting magnet system of claim 3, wherein the one or more cooling assemblies comprise a joint block coupled with the harmonica-shaped tube and comprising a tank in fluid communication with the plurality of channels of the harmonica-shaped tube.

5. The superconducting magnet system of claim 1, wherein the one or more cooling assemblies comprise one or more thermal pads connected with the one or more cooling tubes and in thermal contact with the coil former.

6. The superconducting magnet system of claim 5, wherein the one or more thermal pads comprise a hole accommodating the one or more cooling tubes therethrough and the one or more cooling tubes within the hole are in thermal contact with the one or more thermal pads.

7. The superconducting magnet system of claim 1, wherein the one or more cooling assemblies comprise an electrically conductive shield attached on a surface of the coil former and comprising an electrically and thermally conductive material, and the plurality of superconducting coils are positioned on the same side of both the coil former and the electrically conductive shield.

8. The superconducting magnet system of claim 7, wherein the electrically conductive shield is positioned between the coil former and the plurality of superconducting coils.

9. The superconducting magnet system of claim 7, wherein the electrically conductive shield and the plurality of superconducting coils are respectively positioned on opposite surfaces of the coil former.

10. A superconducting magnet system, comprising:
    a coil former;
    superconducting coils supported by the coil former; and
    one or more thermal conductive devices thermally coupled with the coil former and the superconducting coils, the one or more thermal conductive devices mechanically engaged with the coil former and comprising a flat surface attached on a surface of the coil former to form a thermal conduction therebetween, wherein the one or more thermal conductive devices comprise an electrically conductive shield attached on the surface of the coil former and comprising an electrically and thermally conductive material, and the superconducting coils are positioned on the same side of both the coil former and the electrically conductive shield.

11. The superconducting magnet system of claim 10, wherein the electrically conductive shield is positioned between the coil former and the superconducting coils.

12. The superconducting magnet system of claim 10, wherein the electrically conductive shield and the superconducting coils are respectively positioned on opposite surfaces of the coil former.

13. The superconducting magnet system of claim 10, wherein the one or more thermal conductive devices comprise one or more cooling tubes positioned on the electrically conductive shield for receiving a cryogen passed therethrough.

14. The superconducting magnet system of claim 10, wherein the one or more thermal conductive devices comprise one or more cooling tubes detachably mounted on the coil former and a plurality of fixing elements attaching the one or more cooling tubes to the coil former.

15. The superconducting magnet system of claim 14, wherein the one or more thermal conductive devices comprise one or more thermal pads connected with the one or more cooling tubes and in thermal contact with the coil former.

16. A cooling assembly for cooling a coil former, comprising:
- a plurality of cooling tubes connected with each other for receiving a cryogen passed therethrough and forming at least one cooling circuit therein; and
- a plurality of fixing elements coupled with the plurality of cooling tubes for detachably mounting the cooling tubes to the coil former, wherein the plurality of cooling tubes comprise a harmonica-shaped tube comprising a plurality of channels therein for allowing the cryogen to flow therethrough, and the plurality of channels are in fluid communication with each other.

17. The cooling assembly of claim 16, further comprising one or more thermal pads connected with the plurality of cooling tubes and comprising a thermally conductive material.

\* \* \* \* \*